(12) United States Patent
Bito

(10) Patent No.: US 8,421,120 B2
(45) Date of Patent: Apr. 16, 2013

(54) FIELD EFFECT TRANSISTOR CAPABLE OF REDUCING SHIFT OF THRESHOLD VOLTAGE

(75) Inventor: Yasunori Bito, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 163 days.

(21) Appl. No.: 11/760,899

(22) Filed: Jun. 11, 2007

(65) Prior Publication Data

US 2007/0284568 A1   Dec. 13, 2007

(30) Foreign Application Priority Data

Jun. 13, 2006   (JP) .................................. 2006-163507

(51) Int. Cl.
*H01L 29/66* (2006.01)
(52) U.S. Cl.
USPC ............................................ 257/192; 257/27
(58) Field of Classification Search .................. 257/198, 257/197, 279, 256, 192–195
See application file for complete search history.

(56) References Cited

U.S. PATENT DOCUMENTS

| | | | |
|---|---|---|---|
| 6,876,013 B2 * | 4/2005 | Okano et al. ................... | 257/198 |
| 2002/0003245 A1 * | 1/2002 | Kato et al. ...................... | 257/279 |
| 2003/0183816 A1 * | 10/2003 | Okano et al. ................... | 257/13 |

FOREIGN PATENT DOCUMENTS

| | | |
|---|---|---|
| JP | 11-045992 A | 2/1999 |
| JP | 11-274168 A | 10/1999 |
| JP | 2002-083816 A | 3/2002 |
| JP | 2003-243408 A | 8/2003 |
| JP | 2004-179318 A | 6/2004 |
| JP | 2004-282049 A | 10/2004 |
| JP | 2005-347638 A | 12/2005 |

OTHER PUBLICATIONS

Office Action Issued Jun. 5, 2012, by the Intellectual Property Office of Japan in counterpart Japanese Application No. 2006-163507.
Japanese Office Action issued Jan. 15, 2013 in Japanese Application No. 2006-163507.

* cited by examiner

*Primary Examiner* — Ha Tran T Nguyen
*Assistant Examiner* — Raj R Gupta
(74) *Attorney, Agent, or Firm* — Sughrue Mion, PLLC

(57) ABSTRACT

A problem is arisen in conventional J-FETs that a shifting in a threshold voltage ($V_T$) is generated before or after an energization with a gate current. A junction gate field effect transistor (J-FET) according to the present invention includes an undoped InGaAs channel layer 5, which is capable of accumulating carrier of a first conductivity type, a $p^+$ type GaAs layer 17 (semiconductor layer), which is provided on the undoped InGaAs channel layer 5, and contains an impurity of a second conductivity type, and a gate electrode 18, which is provided on the $p^+$ type GaAs layer 17. Here, the concentration of hydrogen contained in the $p^+$ type GaAs layer 17 is lower than the concentration of the second conductivity type carrier in the $p^+$ type GaAs layer 17.

4 Claims, 20 Drawing Sheets

FIELD EFFECT TRANSISTOR CAPABLE OF REDUCING SHIFT OF THRESHOLD VOLTAGE

This application is based on Japanese patent application No. 2006-163,507, the content of which is incorporated hereinto by reference.

BACKGROUND

1. Technical Field

The present invention relates to a field effect transistor and method for manufacturing thereof.

2. Related Art

For providing further sophisticated performances of field effect transistor (FET) employing gallium arsenide (GaAs), an improvement in a gate forward rising voltage (VF) is required. This is because an improvement in the VF allows providing an increased bias voltage to a gate electrode, thereby increasing a maximum drain current that can be applied to the FET. In order to enhance the VF of the FET, one of effective structures may be an adoption of a p-n junction employed right under a gate electrode exhibiting a barrier, which is higher than a Schottky barrier provided by a metal-semiconductor contact. Japanese Patent Laid-Open No. 2004-179,318 discloses a structure, which is provided with a semiconductor layer selectively doped with a high-concentration of p-type impurity in a gate opening portion at for selectively forming such p-n junction in the gate unit.

FIG. 19 is a cross-sectional view, illustrating a junction gate field effect transistor (J-FET) described in Japanese Patent Laid-Open No. 2004-179,318. An undoped aluminum gallium arsenide (AlGaAs) layer 102, a silicon (Si)-doped AlGaAs electron supply layer 103, an undoped AlGaAs spacer layer 104, an undoped indium gallium arsenide (InGaAs) channel layer 105, an undoped AlGaAs spacer layer 106, a Si-doped AlGaAs electron supply layer 107, an undoped AlGaAs layer 108 and an undoped gallium arsenide (GaAs) layer 109 are sequentially deposited on a gallium arsenide (GaAs) substrate 101. Further, an undoped AlGaAs etch stop layer 129, an undoped GaAs layer 111, a Si-doped AlGaAs wider recess stop layer 112 and a Si-doped GaAs cap layer 113 are sequentially deposited on the undoped GaAs layer 109. A source electrode 114 and a drain electrode 115 are formed on the Si dope GaAs cap layer 113.

A carbon (C)-doped $p^+$ type GaAs layer 130 is formed in recesses formed in the undoped AlGaAs etch stop layer 129 and in the undoped GaAs layer 111. Further, a gate insulating film 116 and a gate electrode 118 are formed in recesses formed in the Si-doped AlGaAs wider recess etch stop layer 112 and in the Si-doped GaAs cap layer 113. The gate electrode 118 and the $p^+$ type GaAs layer 130 constitutes a p-n junction.

In addition to above, prior art documents related to the present invention include: Japanese Patent Laid-Open No. 2004-282,049; Japanese Patent Laid-Open No. 2003-243,408; Japanese Patent Laid-Open No. 2002-83,816; and Japanese Patent Laid-Open No. H11-45,992 (1999).

However, a problem is arisen in the J-FET shown in FIG. 19, in which a threshold voltage ($V_T$) is shifted before or after an energization with a gate current. FIG. 20 is a graph, showing a transmission characteristics before or after an energization with a gate current. As can be seen from the graph, it is found that the $V_T$ is shifted by 110 mV toward the positive side due to a stress caused by the energization in the J-FET of FIG. 19. The reason for causing such $V_T$ shifting is a presence of hydrogen existing in the $p^+$ type GaAs layer 130.

A mechanism thereof is as follows. Hydrogen contained in the $p^+$ type GaAs layer 130 is bound to carbon, which is a p-type impurity, to cause a deactivation of carbon. Thus, an effective p-type impurity concentration of the $p^+$ type GaAs layer 130 is decreased. When an electric current is applied to the gate of the FET, electron is injected in the $p^+$ type GaAs layer 130. Hydrogen bound to carbon is released therefrom by such injected electron to cause a reactivation of carbon, such that the effective p-type impurity concentration in the $p^+$ type GaAs layer 130 is increased. Fermi level of the $p^+$ type GaAs layer 130 is then moved toward the side of the valence band in response to such increase in the concentration, so that the conduction band of the channel layer is lifted, resulting in shifting the $V_T$ toward the positive side.

SUMMARY

According to one aspect of the present invention, there is provided a field effect transistor, comprising: a channel layer, which is capable of accumulating a first conductivity type carrier; a semiconductor layer, provided on the channel layer and containing a second conductivity type impurity; and a gate electrode provided on the semiconductor layer, wherein a concentration of hydrogen contained in the semiconductor layer is lower than a concentration of the second conductivity type carrier in the semiconductor layer. Since the concentration of hydrogen contained in the semiconductor layer is lower than the carrier concentration in the semiconductor layer in this field effect transistor, a quantity of the second conductivity type impurity to be electrically deactivated is smaller. Consequently, variations in the carrier concentration of the second conductivity type is reduced before and after the energization with the gate current, thereby reducing the variation in the threshold voltage.

According to another aspect of the present invention, there is provided a method for manufacturing the field effect transistor as set forth in the above, wherein the method comprises reducing a concentration of hydrogen containing in the semiconductor layer before forming the semiconductor layer.

According to the present invention, a field effect transistor, which is capable of providing a reduced shifting of the threshold voltage before and after the energization with the gate current, and a method for manufacturing thereof, are achieved.

BRIEF DESCRIPTION OF THE DRAWINGS

The above and other objects, advantages and features of the present invention will be more apparent from the following description of certain preferred embodiments taken of certain preferred embodiments in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Exemplary implementations of field effect transistors according to the present invention will be described in reference to the annexed figures. In all figures, identical numeral is assigned to an element commonly appeared in the description of the present invention in reference to the figures, and the detailed description thereof will not be repeated.

Figure 1:
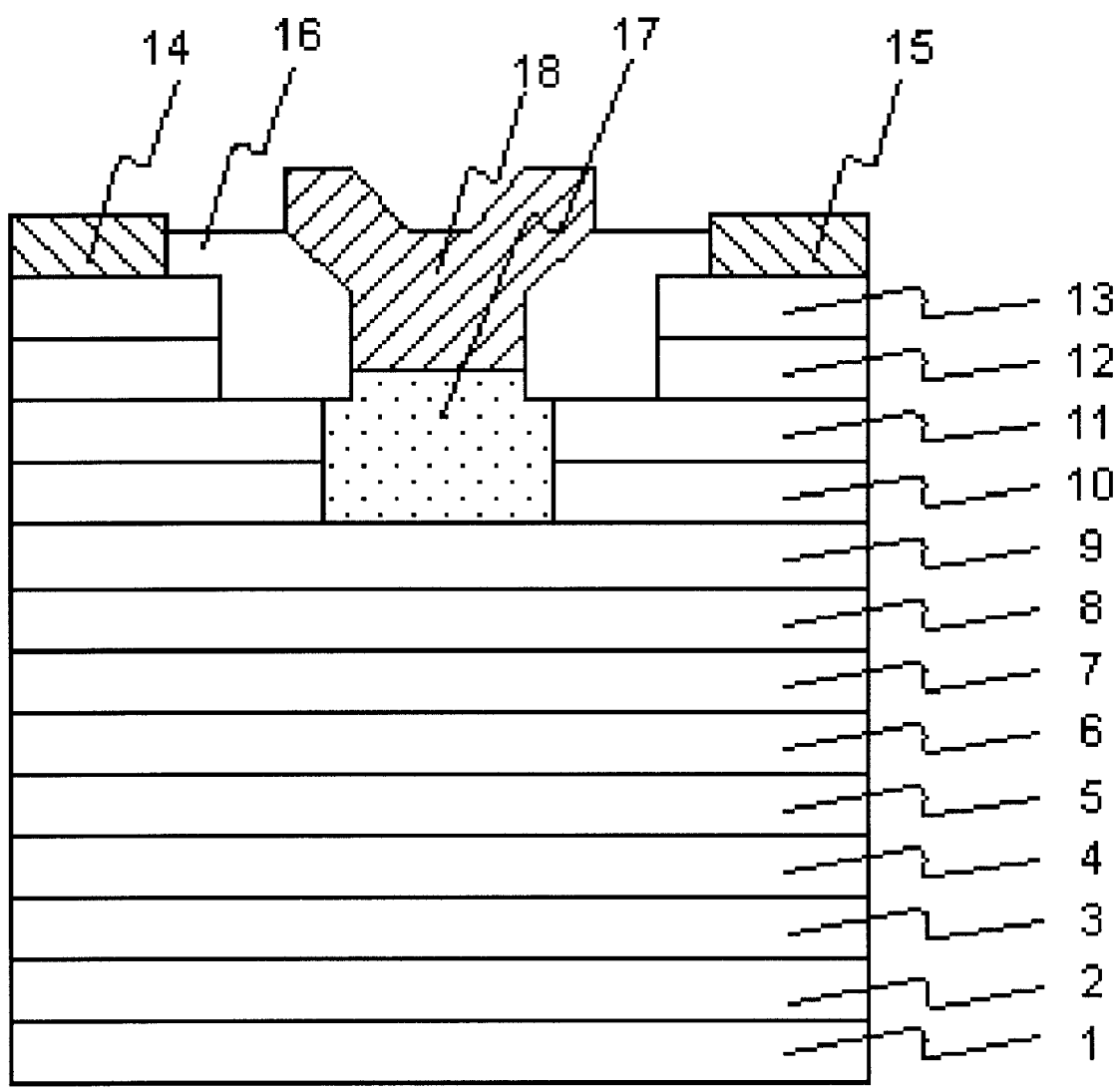
FIG. 1 is a cross-sectional view, illustrating a field effect transistor of an embodiment according to the present invention.

FIG. 1 is a cross-sectional view, illustrating an embodiment of a field effect transistor according to the present invention. A junction gate field effect transistor (J-FET) described here includes an undoped InGaAs channel layer 5, which is capable of accumulating carrier of a first conductivity type, a p$^+$ type GaAs layer 17 (semiconductor layer), which is provided on the undoped InGaAs channel layer 5, and contains an impurity of a second conductivity type, and a gate electrode 18, which is provided on the p$^+$ type GaAs layer 17. Here, the concentration of hydrogen contained in the p$^+$ type GaAs layer 17 is lower than the concentration of the second conductivity type carrier in the p$^+$ type GaAs layer 17. In the present embodiment, the first and the second conductivity types are n-type and p-type, respectively.

The more detailed structure of the J-FET shown in FIG. 1 will be further described. An undoped AlGaAs buffer layer 2, a Si-doped AlGaAs electron supply layer 3, an undoped AlGaAs spacer layer 4, an undoped InGaAs channel layer 5, an undoped AlGaAs spacer layer 6, a Si-doped AlGaAs electron supply layer 7, an undoped AlGaAs layer 8 and an undoped GaAs layer 9 are sequentially stacked on the semi-insulative GaAs substrate 1. Further, an undoped InGaP etch stop film layer 10, an undoped GaAs layer 11, a Si-doped AlGaAs wider recess etch stop layer 12 and a Si-doped GaAs cap layer 13 are sequentially stacked on the undoped GaAs layer 9. A source electrode 14 and a drain electrode 15, which are composed of AuGe—Ni—Au alloy, for example, are formed on the GaAs cap layer 13.

The undoped InGaP etch stop layer 10 and the undoped GaAs layer 11 are provided with a first recess. The first recess is filled with the p$^+$ type GaAs layer 17 containing C (carbon) serving as a p-type impurity. Further, the Si-doped AlGaAs wider recess etch stop layer 12 and the Si-doped GaAs cap layer 13 are provided with a second recess, which is larger than the first recess. Such second recess is provided with the gate insulating film 16 composed of, for example, SiO$_2$ and the gate electrode 18 composed of, for example, WSi, both of which are formed therein. The p$^+$ type GaAs layer 17 is in contact with the gate electrode 18 to form a p-n junction. Here, the concentration of hydrogen contained in the p$^+$ type GaAs layer 17 is lower than the p-type carrier concentration in the p$^+$ type GaAs layer 17.

When the p$^+$ type GaAs layer 17 includes larger quantity of remaining hydrogen in the manufacture of the J-FET, an operation for reducing the concentration of hydrogen contained in the p$^+$ type GaAs layer 17 may be performed after forming the p$^+$ type GaAs layer 17 and before forming the gate electrode 18 on the p$^+$ type GaAs layer 17. Such reduction in the concentration of hydrogen can be achieved by exhausting remained hydrogen from the p$^+$ type GaAs layer 17 by an annealing process. Such annealing process may be performed at a thermal processing temperature of equal to or higher than 400 degrees C. to obtain a sufficiently reduced concentration of hydrogen. Further, such annealing process may preferably be carried out within a hydrogen (H$_2$) gas-free atmosphere, and it is particularly preferable to be carried out within a nitrogen (N$_2$) gas atmosphere.

Since the concentration of hydrogen contained in the p$^+$ type GaAs layer 17 is lower than the carrier concentration in the p$^+$ type GaAs layer 17 in the present embodiment, a quantity of the p-type impurity to be electrically deactivated (carbon (C) in the present embodiment) is also reduced. Consequently, before and after the energization with the gate current, a variation in the p-type carrier concentration is reduced, providing a reduced variation in the threshold voltage.

EXAMPLES

Example 1

In the J-FET shown in FIG. 1, a film thickness and an impurity concentration of each layer were determined as follows:

Undoped AlGaAs buffer layer 2: film thickness 500 nm;

Si-doped AlGaAs electron supply layer 3: film thickness 4 nm; Si concentration: $3\times10^{18}$ cm$^{-3}$;

Undoped AlGaAs spacer layer 4: film thickness 2 nm;

Undoped InGaAs channel layer 5: film thickness 15 nm;

Undoped AlGaAs spacer layer 6: film thickness 2 nm;

Si-doped AlGaAs electron supply layer 7: film thickness 9 nm; Si concentration: $3\times10^{18}$ cm$^{-3}$;

Undoped AlGaAs layer 8: film thickness 5 nm;

Undoped GaAs layer 9: film thickness 5 nm;

Undoped InGaP etch stop layer 10: film thickness 5 nm;

Undoped GaAs layer 11: film thickness 15 nm;

Si-doped AlGaAs wider recess etch stop layer 12: film thickness 5 nm; Si concentration: $4\times10^{18}$ cm$^{-3}$;

Si-doped GaAs cap layer 13: film thickness 100 nm; Si concentration: $4\times10^{18}$ cm$^{-3}$; and p$^+$ type GaAs layer 17: film thickness 80 nm.

Further, a p-type carrier concentration in the p$^+$ type GaAs layer 17 was $1\times10^{20}$ cm$^{-3}$, and a concentration of hydrogen contained in the p$^+$ type GaAs layer 17 was $5\times10^{17}$ cm$^{-3}$. Measurements of the carrier concentration were performed by a hole measurement. This was also equally applied for the other examples. In addition to above, the p-type impurity concentration in the p$^+$ type GaAs layer 17 is preferably higher than the impurity concentration in the n$^+$ type AlGaAs electron supply layer 7, namely $3\times10^{18}$ cm$^{-3}$, and more preferably not lower than $3\times10^{19}$ cm$^{-3}$, which is one digit higher than the impurity concentration in the layer 7. A depleted layer having an appropriate width can be formed in the p$^+$ type GaAs layer 17, by providing an increased p-type impurity concentration in the p$^+$ type GaAs layer 17 as compared with the impurity concentration in the n$^+$ type AlGaAs electron supply layer 7.

As described above, the concentration of hydrogen contained in the p$^+$ type GaAs layer 17 in the present example was $5\times10^{17}$ cm$^{-3}$. On the other hand, the p-type carrier concentration in the p$^+$ type GaAs layer 17 is $1\times10^{20}$ cm$^{-3}$. Therefore, even if deactivated carbon with hydrogen at a concentration of $5\times10^{17}$ cm$^{-3}$ is entirely re-activated by an energization with an electric current, this means that there is only an increase of mere 0.5% over the whole carrier concentration of $1\times10^{20}$ cm$^{-3}$ and a shifting of the Fermi level is also smaller. Actually, a $V_T$ shifting quantity was measured, and sufficiently smaller value of 12 mV was obtained.

Such $V_T$ shifting quantity is preferably equal to or lower than 20 mV, in view of achieving a stability in the characteristics of the circuit that employs the J-FET. Actually, in a circuit that contains the J-FET of the present example having a $V_T$ shifting quantity of 12 mV, a variation or the like in the set current is inhibited, thereby providing a stable circuit characteristics.

Further, $V_T$ shifting quantities were evaluated in cases of exhibiting the p-type carrier concentration before the energization of $4\times10^{19}$ cm$^{-3}$, $1\times10^{20}$ cm$^{-3}$ and $1.5\times10^{20}$ cm$^{-3}$, by employing J-FETs containing p$^+$ type GaAs layers having different concentrations of remained hydrogen.

Figure 2:
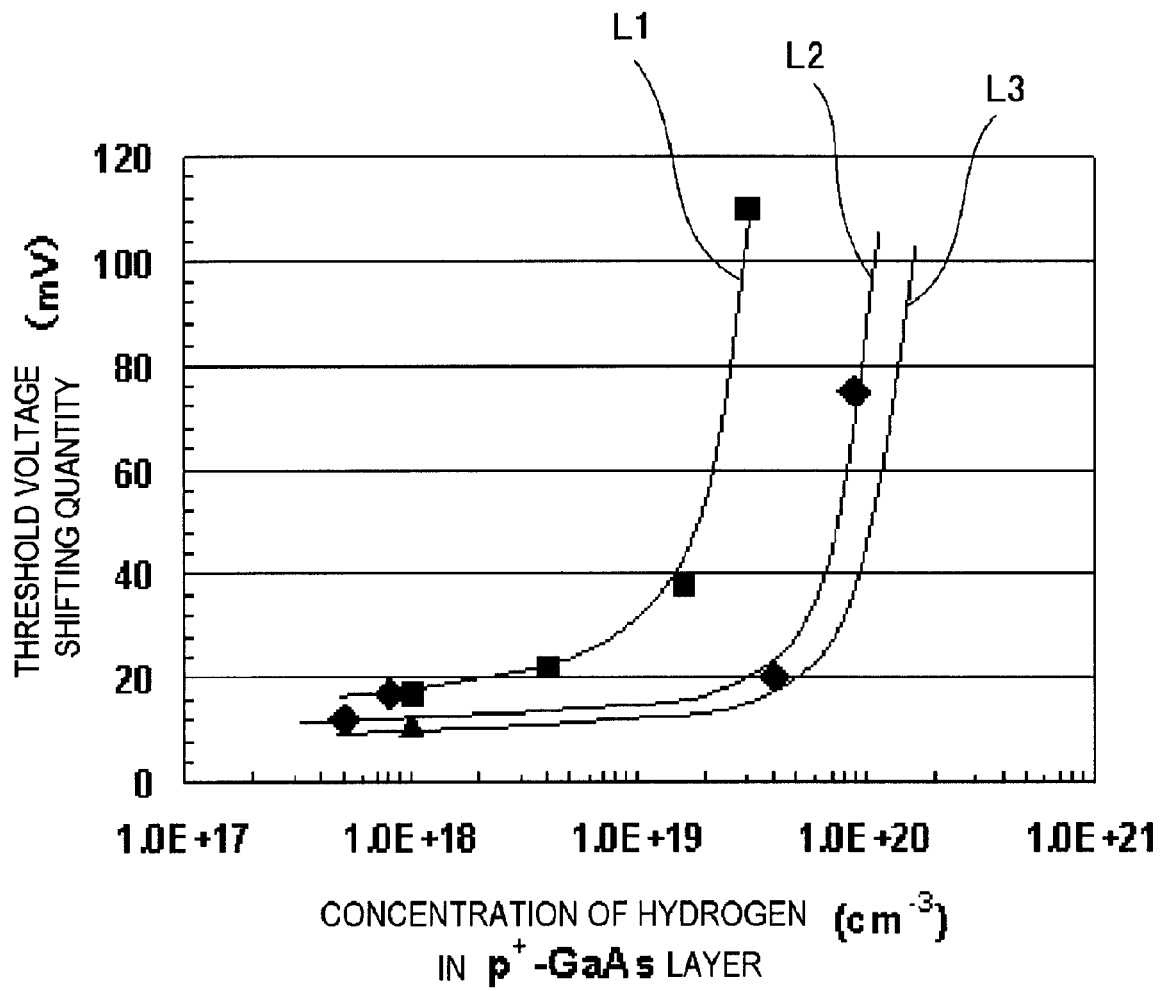
FIG. 2 is a graph, showing a relationship of a $V_T$ shifting quantity with a concentration of hydrogen contained in a $p^+$ type GaAs layer.

FIG. 2 is a graph, showing a relationship of a $V_T$ shifting quantity with a concentration of hydrogen contained in the p$^+$ type GaAs layer. Ordinate represents $V_T$ shifting quantity (mV), and abscissa represents concentration of hydrogen (cm$^{-3}$). Further, lines L1, L2 and L3 correspond to the cases of exhibiting the p-type carrier concentration before the energization of $4\times10^{19}$ cm$^{-3}$, $1\times10^{20}$ cm$^{-3}$ and $1.5\times10^{20}$ cm$^{-3}$, respectively. As can be seen from this graph, the $V_T$ shifting quantity is decreased as the concentration of hydrogen is reduced. Further, higher p-type carrier concentration before the energization provides smaller $V_T$ shifting quantity, for the same concentration of remained hydrogen. This is because a ratio of an increase in the energizing-activated p-type carrier concentration over the p-type carrier concentration that determines conduction band potential before the energization is reduced.

Figure 3:
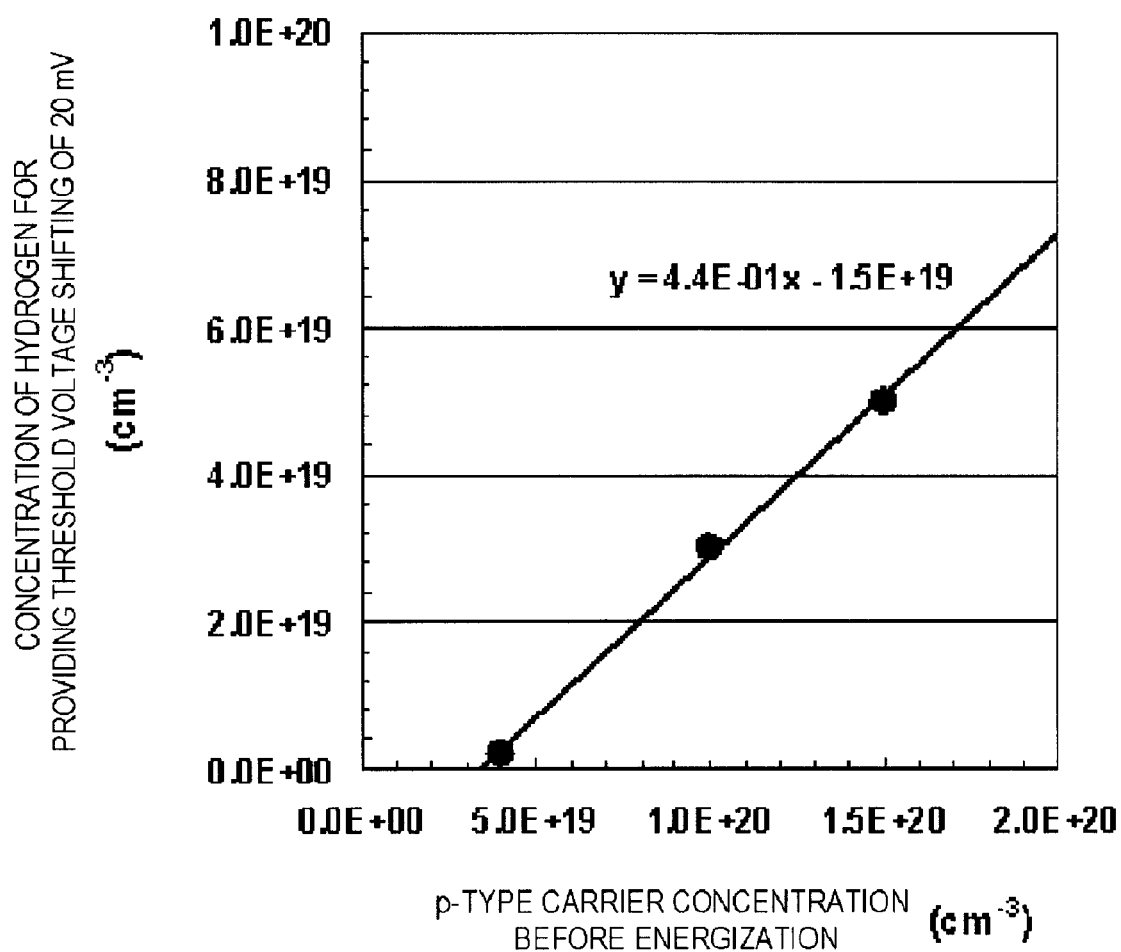
FIG. 3 is a graph, showing plots of concentrations of remained hydrogen for respective p-type carrier densities that provides a $V_T$ shifting quantity of 20 mV based on the results shown in FIG. 2.

FIG. 3 is a graph, showing plots of concentrations of remained hydrogen for respective p-type carrier densities that provides a $V_T$ shifting quantity of 20 mV based on the results shown in FIG. 2. In the case of the p-type carrier concentration of $4\times10^{19}$ cm$^{-3}$, it is sufficient to have the concentration of remained hydrogen of equal to or lower than $2\times10^{18}$ cm$^{-3}$ for reducing the $V_T$ shifting quantity to achieve equal to or lower than 20 mV. In the case of the p-type carrier concentration of $1\times10^{20}$ cm$^{-3}$, it is sufficient to have the concentration of remained hydrogen of equal to or lower than $3\times10^{19}$ cm$^{-3}$ for reducing the $V_T$ shifting quantity to achieve equal to or lower than 20 mV. In the case of the p-type carrier concentration of $1.5\times10^{20}$ cm$^{-3}$, it is sufficient to have the concentration of remained hydrogen of equal to or lower than $5\times10^{19}$ cm$^{-3}$ for reducing the $V_T$ shifting quantity to achieve equal to or lower than 20 mV. It can be understood in the basis of these data that it is sufficient to satisfy the following formula (1) for the concentration of remained hydrogen in order to obtain the $V_T$ shift of equal to or lower than 20 mV:

$$dh \leq 4.4\times10^{-1}\times dc - 1.5\times10^{19} \qquad (1)$$

Here, dh is a concentration of remained hydrogen [cm$^{-3}$], and dc is a p-type carrier concentration [cm$^{-3}$].

Further, it can be understood from FIG. 2 that, if the concentration of remained hydrogen is equal to or lower than $2\times10^{18}$ cm$^{-3}$, the $V_T$ shifting quantity can be reduced in a stable manner even if the p-type carrier concentration is changed.

Example 2

Figure 4:
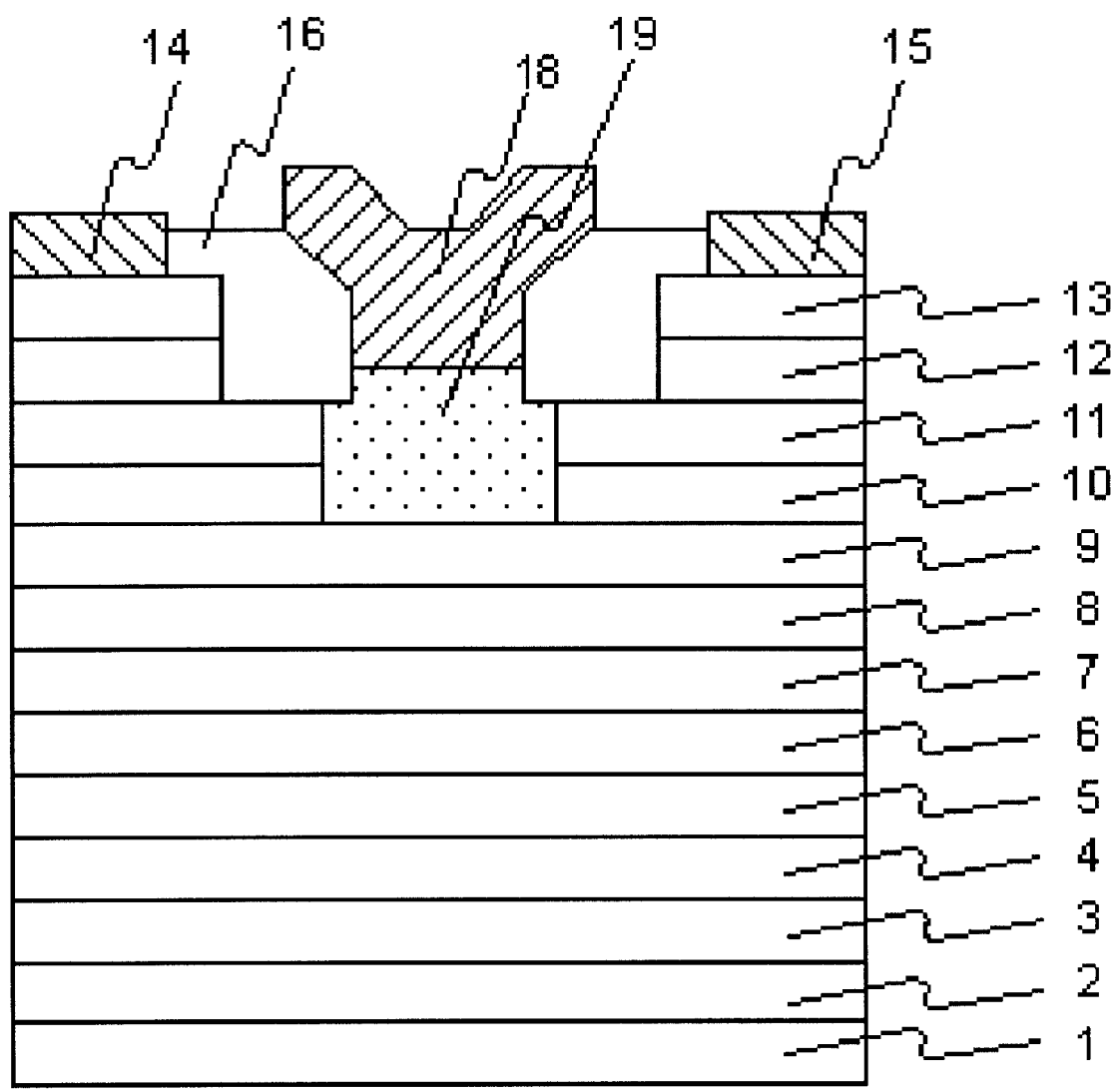
FIG. 4 is a cross-sectional view, illustrating a J-FET according to second example of the present invention.

FIG. 4 is a cross-sectional view, illustrating a J-FET of second example of according to the present invention. In the present example, a p$^+$ type GaAs layer 19 is provided, in place of the p$^+$ type GaAs layer 17 of FIG. 1. Zinc (Zn) was doped added as the p-type impurity in such p$^+$ type GaAs layer 19 at a concentration of $1\times10^{20}$ cm$^{-3}$. Further, a concentration of remained hydrogen in the p$^+$ type GaAs layer 19 was $1\times10^{18}$ cm$^{-3}$. Other constitutions of the J-FET of FIG. 4 are similar to that of the J-FET of FIG. 1.

Since Zn is deactivated by remained hydrogen similarly as carbon (C) even if Zn is employed as the p-type impurity, the $V_T$ shifting quantity can be reduced to equal to or lower than 20 mV by reducing remaining hydrogen at a concentration of equal to or lower than $2\times10^{18}$ cm$^{-3}$. Actually, a $V_T$ shifting quantity was measured in this example, and a value of 15 mV was obtained. In addition to above, similar advantageous effect can be obtained when beryllium (Be) or magnesium (Mg) is employed as the p-type impurity.

Example 3

Figure 5:
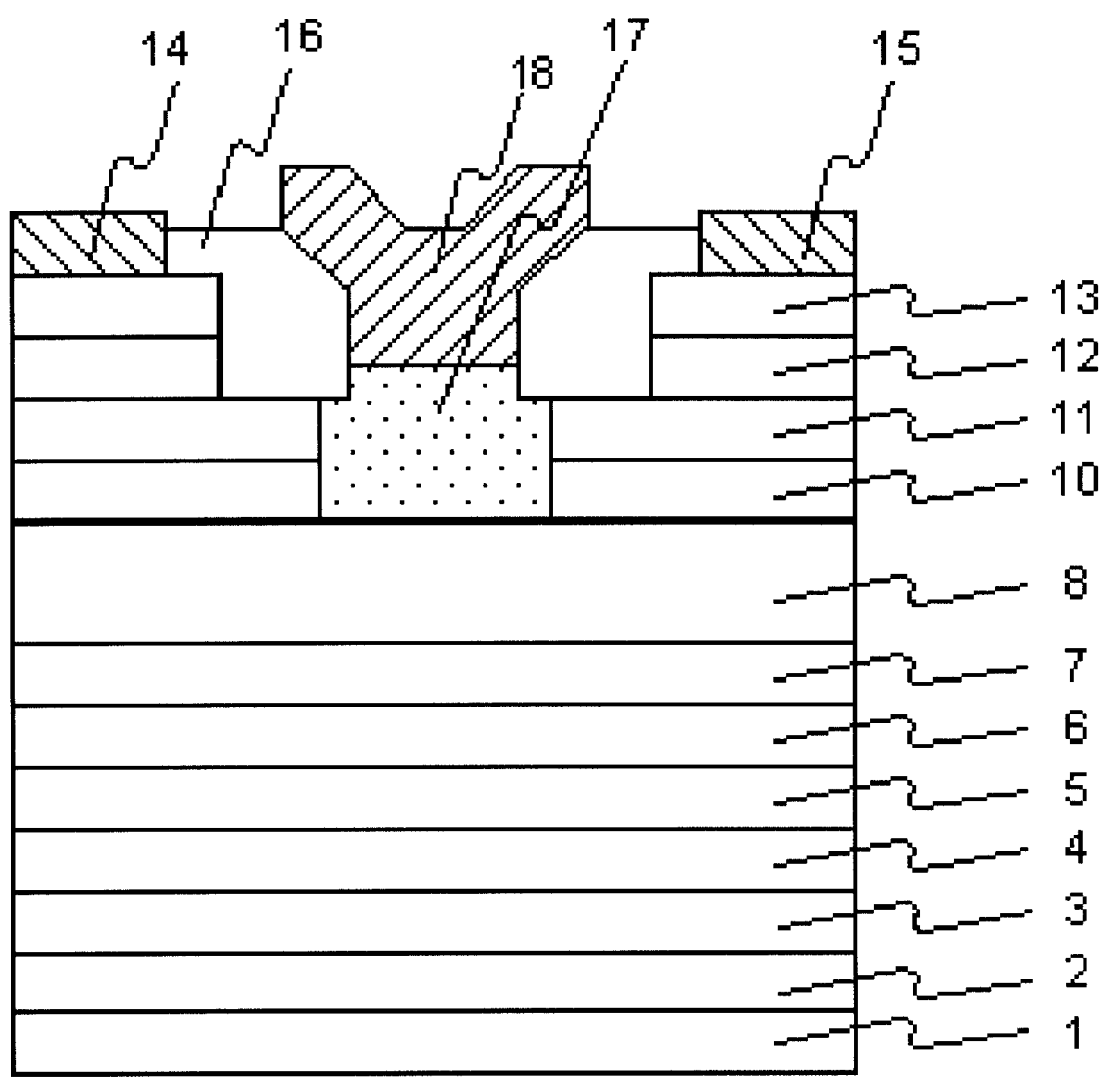
FIG. 5 is a cross-sectional view, illustrating a J-FET according to third example of the present invention.

FIG. 5 is a cross-sectional view, illustrating a J-FET of third example according to the present invention. In the present example, the undoped GaAs layer 9 of FIG. 1 was not provided. Other constitutions of the J-FET of FIG. 5 are similar to that of the J-FET of FIG. 1.

It was found that similar advantageous effects as obtained in the above-described examples were also obtained, even if the different epitaxial layer structure under the p$^+$ type GaAs layer 17 was employed in this manner. Since the concentration of remained hydrogen was reduced to equal to or lower than $2\times10^{18}$ cm$^{-3}$ in the present example, the $V_T$ shifting quantity was equal to or lower than 20 mV.

Example 4

Figure 6:
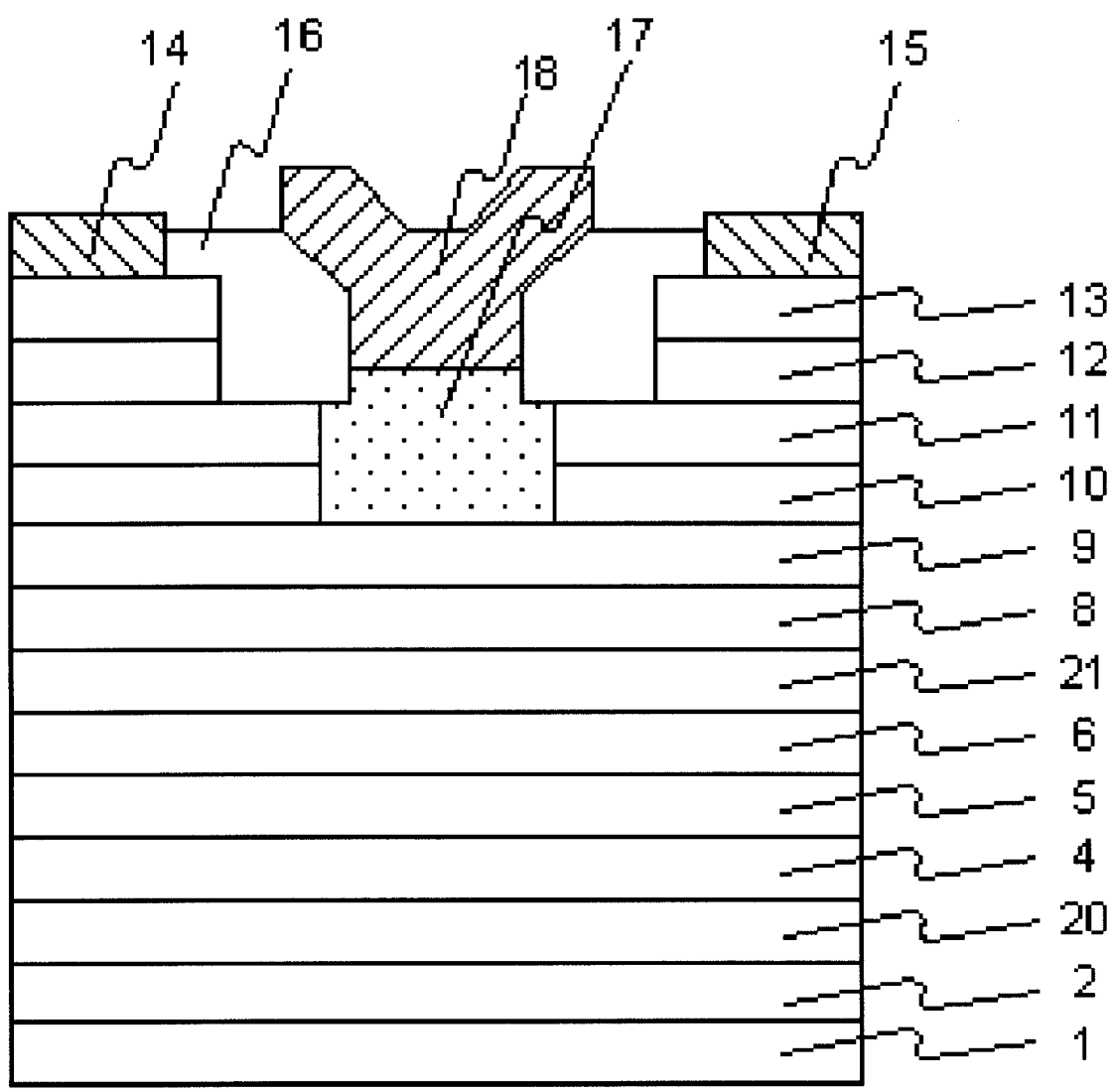
FIG. 6 is a cross-sectional view, illustrating a J-FET according to fourth example of the present invention.

FIG. 6 is a cross-sectional view, illustrating a J-FET of fourth example according to the present invention. In the present example, a Si-doped InGaP layer 20 and a Si-doped InGaP layer 21 were provided instead of the Si-doped AlGaAs electron supply layer 3 and the Si-doped AlGaAs electron supply layer 7 of FIG. 1, respectively. Other constitutions of the J-FET of FIG. 6 are similar to that of the J-FET of FIG. 1. Since the concentration of remained hydrogen was reduced to equal to or lower than $2\times10^{18}$ cm$^{-3}$ in the present example, the $V_T$ shifting quantity was equal to or lower than 20 mV.

Example 5

Figure 7:
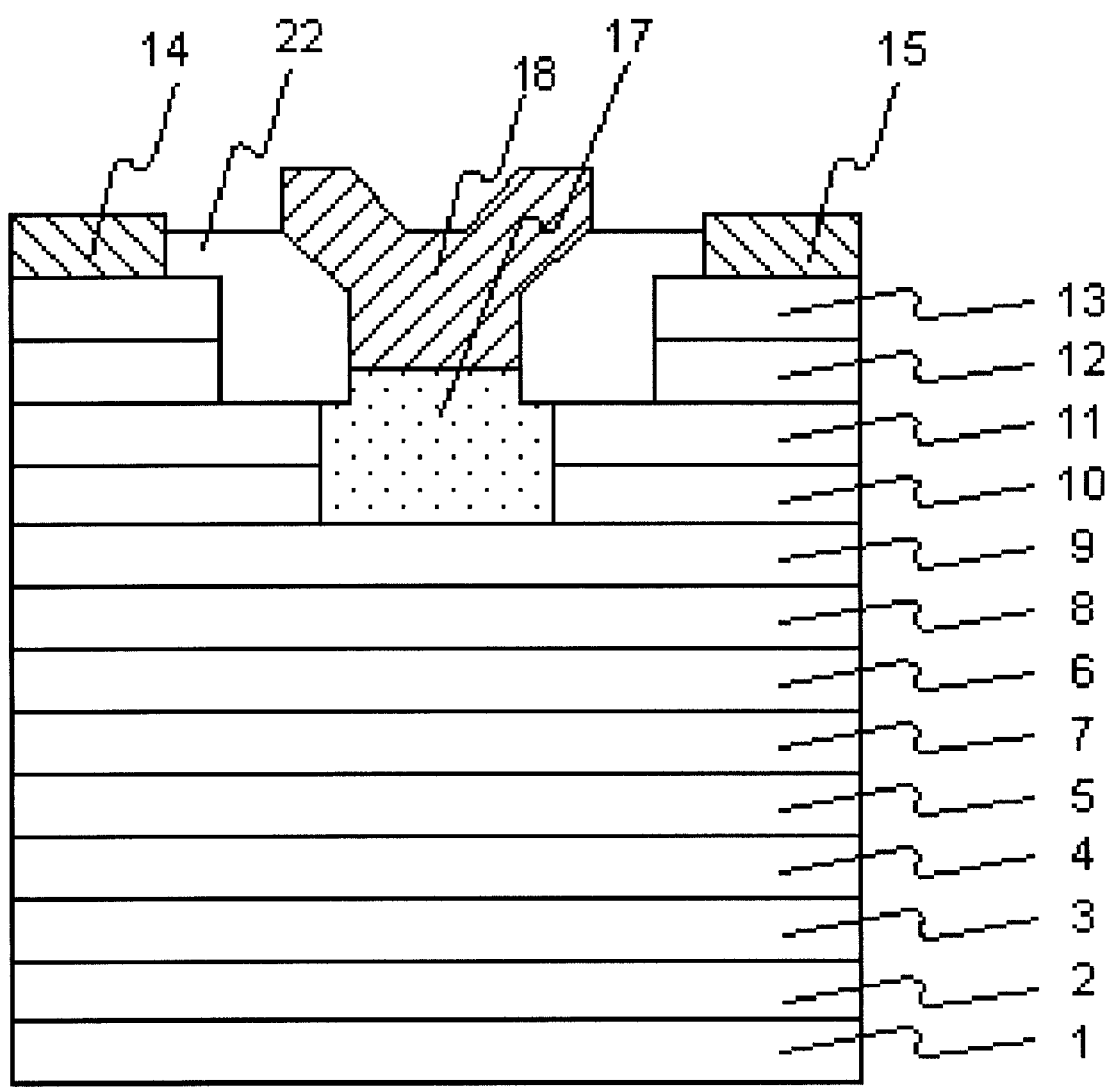
FIG. 7 is a cross-sectional view, illustrating a J-FET according to fifth example of the present invention.

FIG. 7 is a cross-sectional view, illustrating a J-FET of fifth example according to the present invention. In the present example, a gate insulating film 22 composed of silicon nitride (SiN$_x$) is provided, in place of the gate insulating film 16 of FIG. 1. Other constitutions of the J-FET of FIG. 7 are similar to that of the J-FET of FIG. 1.

It was found that similar advantageous effects as obtained in the above-described examples were also obtained, even if other type of the insulating film except the SiO$_2$ film was employed for the gate insulating film that is in contact with the p$^+$ type GaAs layer 17 in this manner. A smaller $V_T$ shifting quantity of 15 mV was also obtained in the present example. In addition to above, a smaller $V_T$ shifting quantity was similarly obtained when the gate insulating film 22 was composed of silicon oxynitride (SiON).

Example 6

Figure 8:
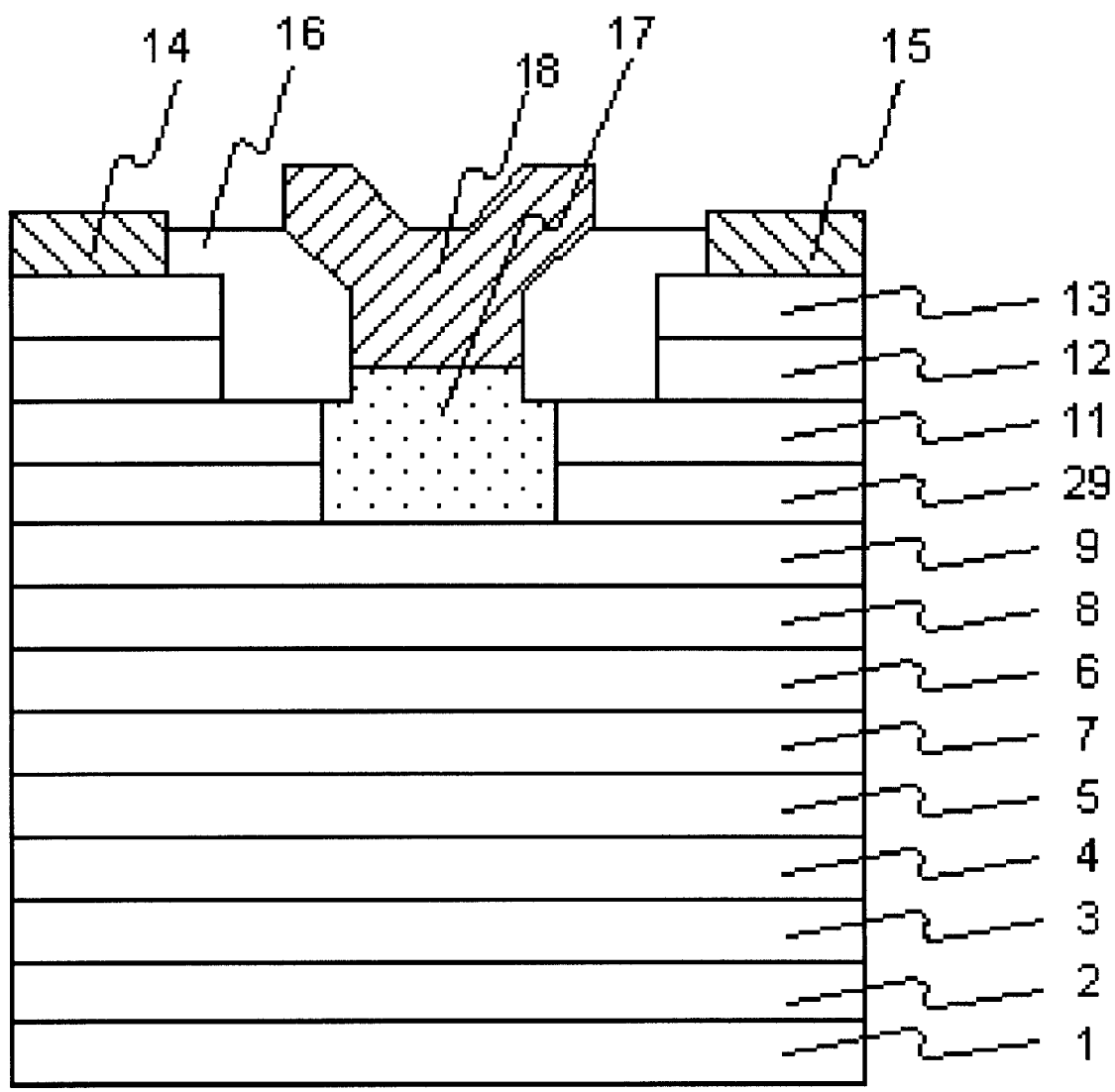
FIG. 8 is a cross-sectional view, illustrating a J-FET according to sixth example of the present invention.

FIG. 8 is a cross-sectional view, illustrating a J-FET of sixth example according to the present invention. In the present example, an undoped AlGaAs etch stop layer 29 was provided, in place of the undoped InGaP etch stop layer 10 of FIG. 1. Other constitutions of the J-FET of FIG. 8 are similar to that of the J-FET of FIG. 1.

When the AlGaAs layer was employed as the second recess etch stop film in this manner, similar advantageous effect as obtained in the above-described examples was also obtained. A smaller $V_T$ shifting quantity of 15 mV was also obtained in the present example.

Example 7

Figure 9:
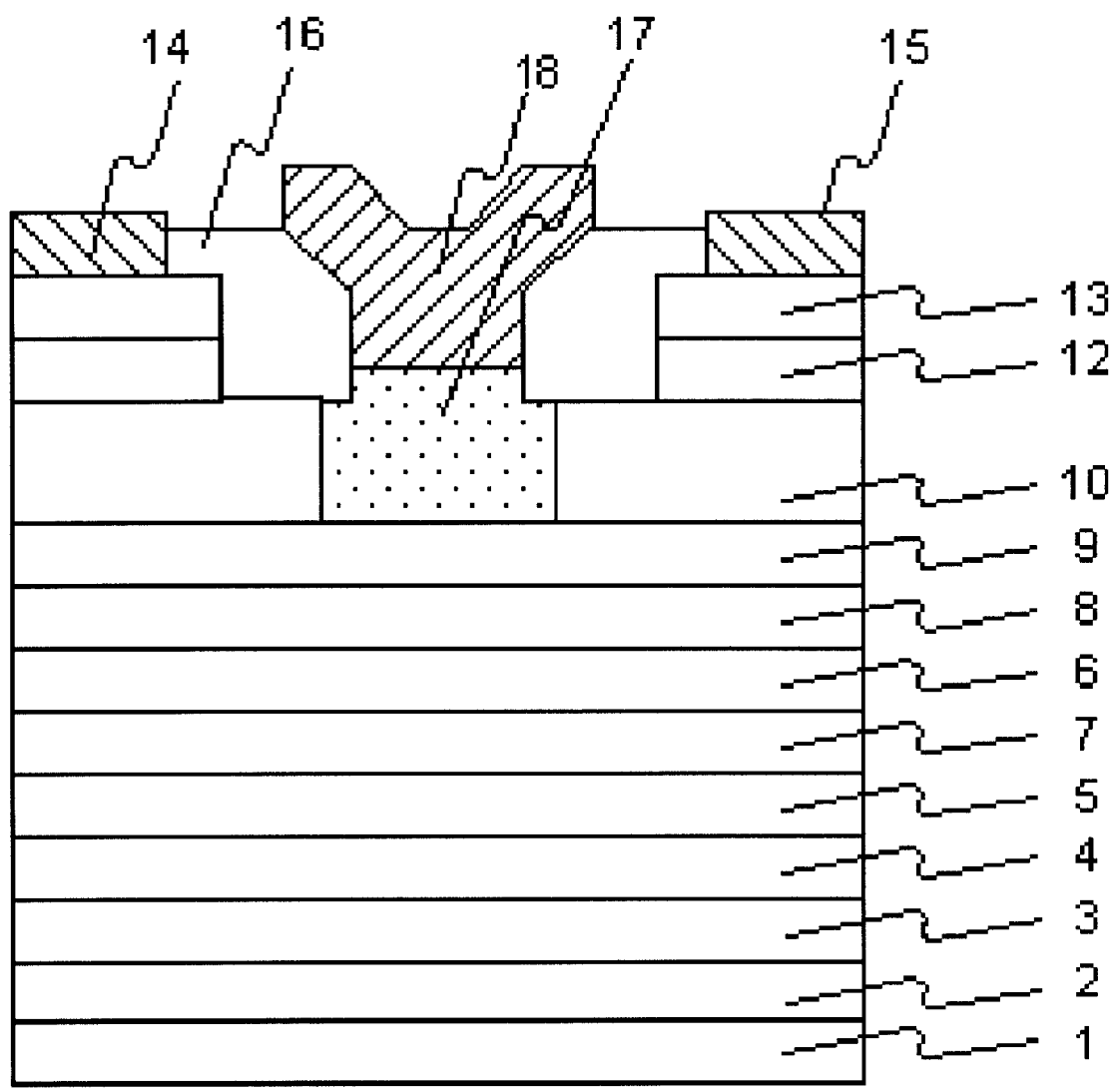
FIG. 9 is a cross-sectional view, illustrating a J-FET according to seventh example of the present invention.

FIG. 9 is a cross-sectional view, illustrating a J-FET of seventh example according to the present invention. In the present example, the undoped GaAs layer 11 of FIG. 1 was not provided. Due to this structural feature, the first recess was formed in one semiconductor layer (i.e., undoped InGaP etch stop layer 10). Other constitutions of the J-FET of FIG. 9 are similar to that of the J-FET of FIG. 1.

It was found that similar advantageous effects as obtained in the above-described examples were also obtained, even if the p$^+$ type GaAs layer 17 containing a reduced amount of remaining hydrogen was provided in the recess, which was formed by removing one semiconductor layer by an etching. A smaller $V_T$ shifting quantity of 15 mV was also obtained in the present example.

Example 8

Figure 10:
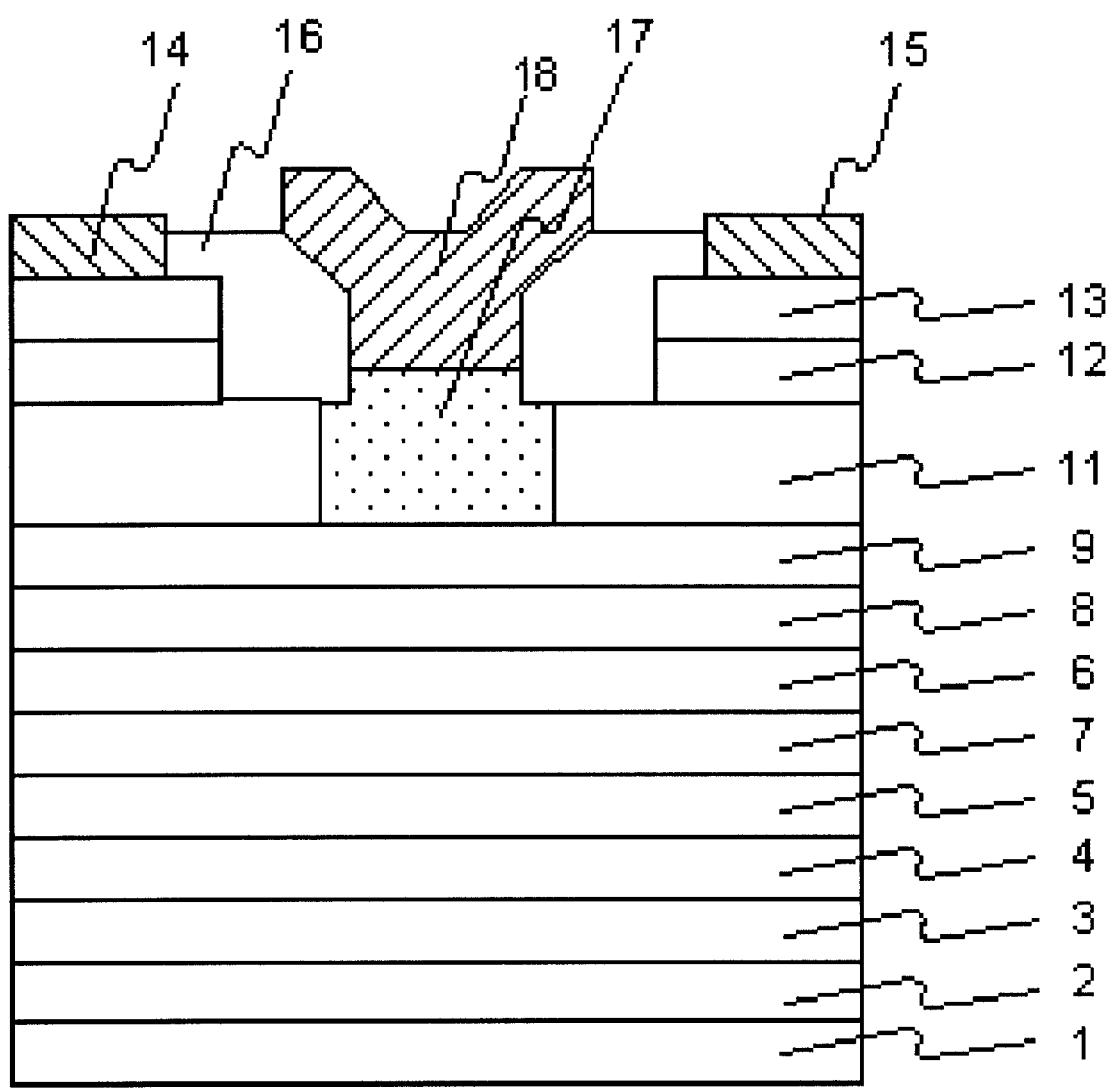
FIG. 10 is a cross-sectional view, illustrating a J-FET according to eighth example of the present invention.

FIG. 10 is a cross-sectional view, illustrating a J-FET of eighth example according to the present invention. In the present example, the undoped InGaP etch stop layer 10 of FIG. 1 was not provided. Due to this structural feature, the first recess was formed in one semiconductor layer (i.e., undoped GaAs layer 10). Other constitutions of the J-FET of FIG. 10 are similar to that of the J-FET of FIG. 1. A smaller $V_T$ shifting quantity of 15 mV was also obtained in the present example.

Example 9

Figure 11:
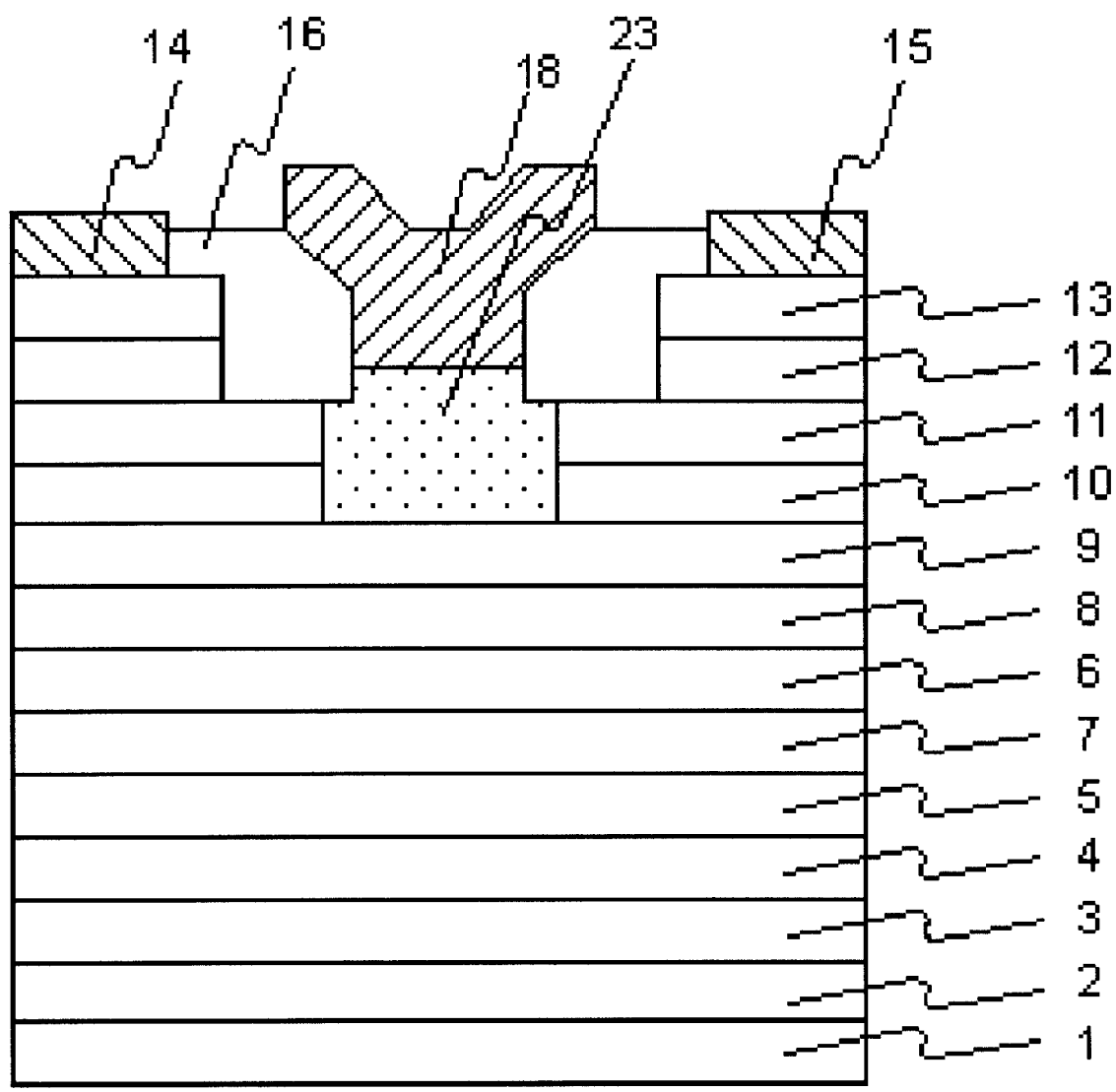
FIG. 11 is a cross-sectional view, illustrating a J-FET according to ninth example of the present invention.

FIG. 11 is a cross-sectional view, illustrating a J-FET of ninth example according to the present invention. In the present example, a p$^+$ type AlGaAs layer 23 was provided, in place of the p$^+$ type GaAs layer 17 of FIG. 1. Other constitutions of the J-FET of FIG. 11 are similar to that of the J-FET of FIG. 1.

It was found that similar advantageous effects as obtained in the above-described examples were also obtained, even if the p$^+$ type AlGaAs layer 23 was employed for the p-type semiconductor layer having a reduced concentration of hydrogen. A smaller $V_T$ shifting quantity of 18 mV was also obtained in the present example.

Example 10

Figure 12:
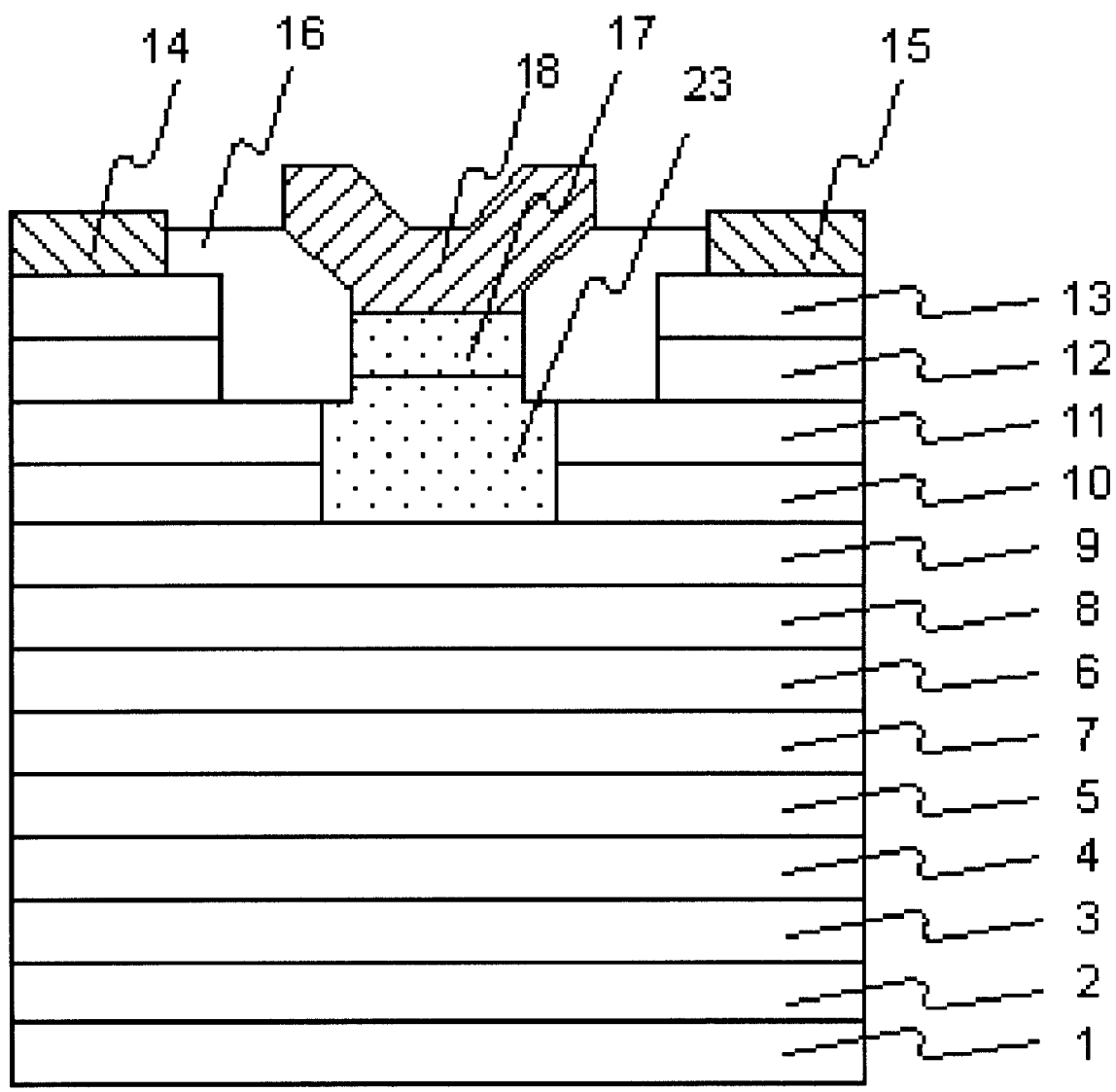
FIG. 12 is a cross-sectional view, illustrating a J-FET according to tenth example of the present invention.

FIG. 12 is a cross-sectional view, illustrating a J-FET of tenth example according to the present invention. In the present example, a multiple-layered structure composed of the p$^+$ type GaAs layer 17 and the p$^+$ type AlGaAs layer 23 was applied for the p-type semiconductor layer having reduced concentration of hydrogen. Other constitutions of the J-FET of FIG. 12 are similar to that of the J-FET of FIG. 1. It was found that similar advantageous effects as obtained in the above-described examples were also obtained in the present example. In addition to above, similar advantageous effect can be obtained by employing semiconductor layers constituted by either one of or two or more selected from the p$^+$ type InGaAs layer, the p$^+$ type InGaP layer and the p$^+$ type gallium nitride (GaN) layer, in place of the p$^+$ type GaAs layer 17.

Example 11

Figure 13:
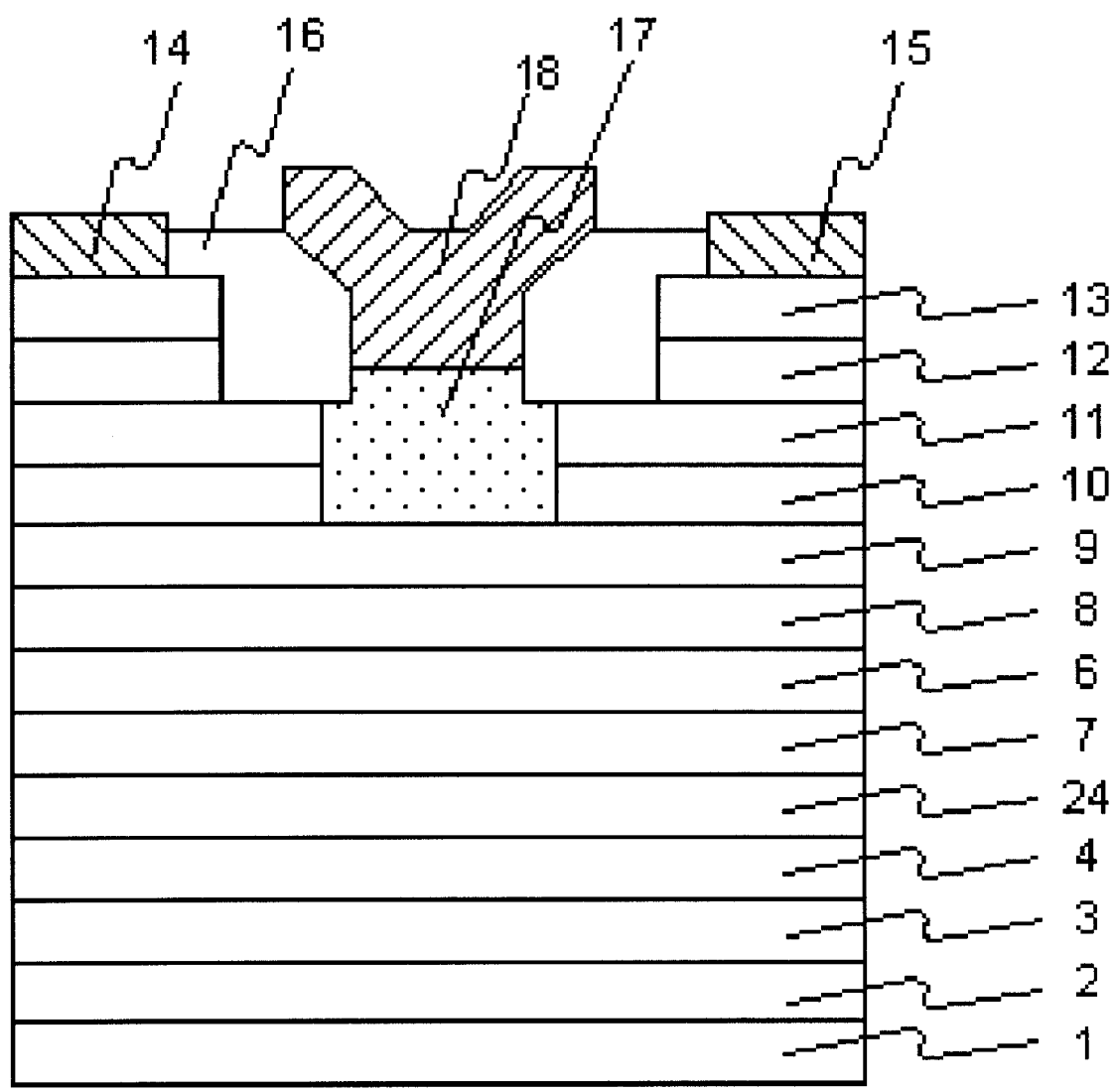
FIG. 13 is a cross-sectional view, illustrating a J-FET according to eleventh example of the present invention.

FIG. 13 is a cross-sectional view, illustrating a J-FET of eleventh example according to the present invention. In the present example, an undoped GaAs channel layer 24 was provided in place of the undoped InGaAs channel layer 5 of FIG. 1. Other constitutions of the J-FET of FIG. 13 are similar to that of the J-FET of FIG. 1.

It was found that similar advantageous effects as obtained in the above-described examples were also obtained, even if the undoped GaAs layer was employed as the channel layer in this manner. A smaller $V_T$ shifting quantity of 15 mV was also obtained in the present example.

Example 12

Figure 14:
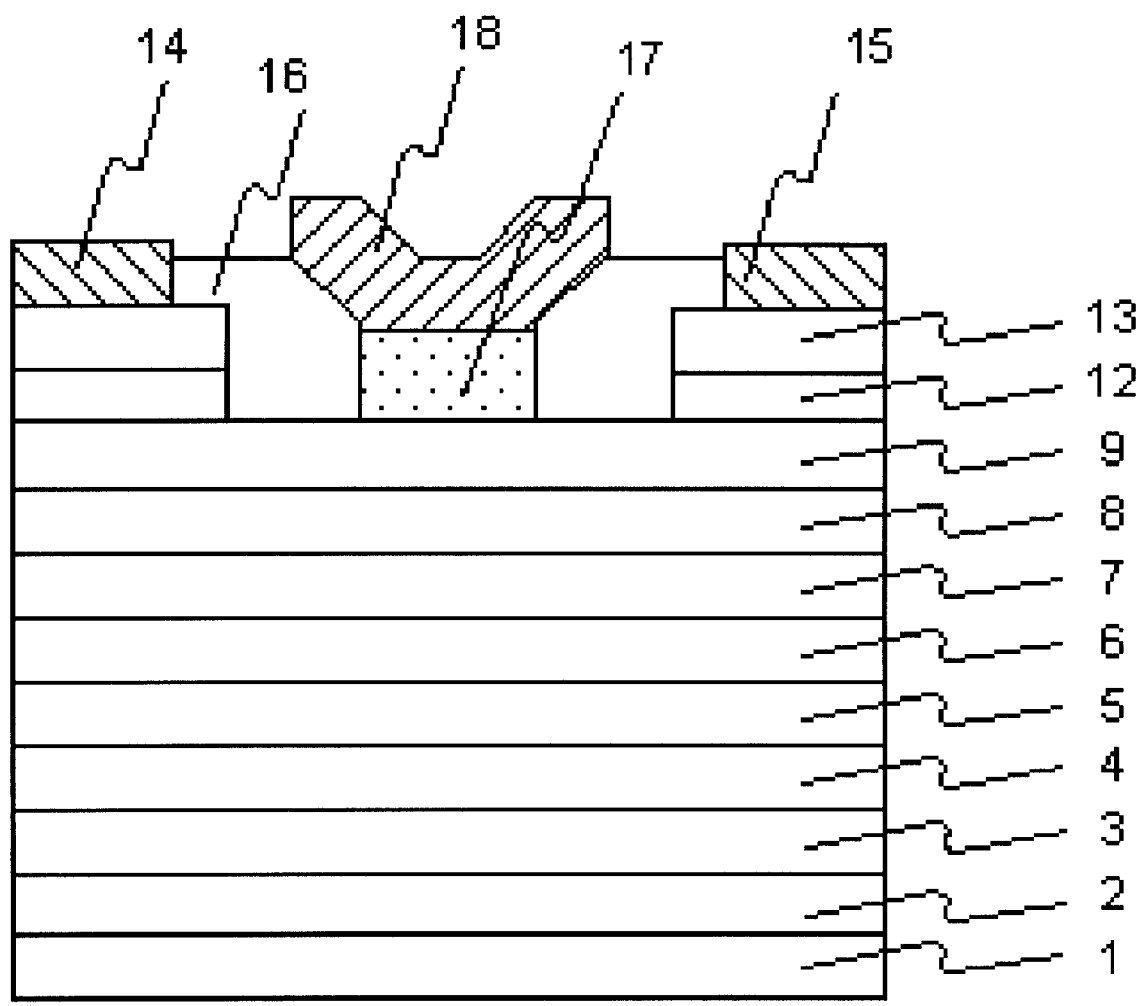
FIG. 14 is a cross-sectional view, illustrating a J-FET according to twelfth example of the present invention.

FIG. 14 is a cross-sectional view, illustrating a J-FET of twelfth example according to the present invention. In the present example, a p$^+$ type GaAs layer 17 was provided on the undoped GaAs layer 9 having no recess formed therein. Other constitutions of the J-FET of FIG. 14 are similar to that of the J-FET of FIG. 1. It was found that similar advantageous effects as obtained in the above-described examples were also obtained, even if the structure having no first recess was employed in this manner.

Example 13

Figure 15:
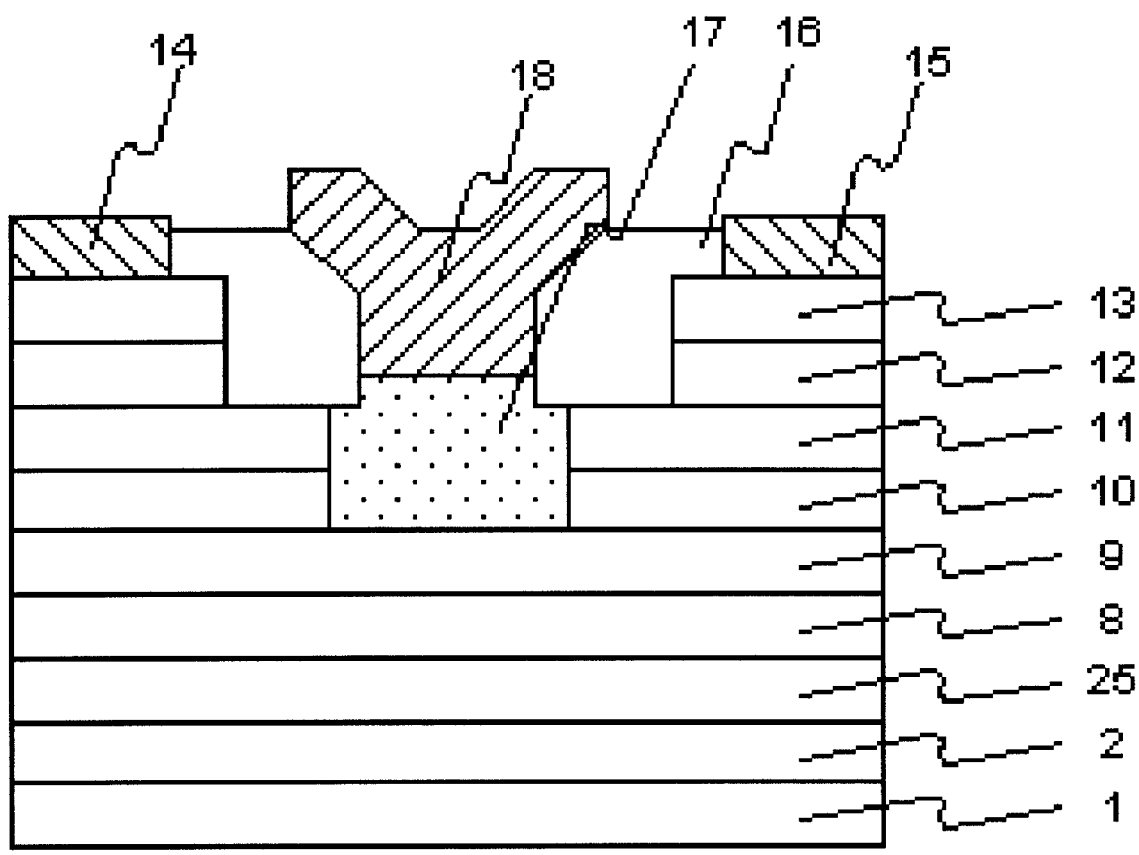
FIG. 15 is a cross-sectional view, illustrating a J-FET according to thirteenth example of the present invention.

FIG. 15 is a cross-sectional view, illustrating a J-FET of thirteenth example according to the present invention. In the present example, a buried p-n junction gate was provided on an i-GaAs/i-AlGaAs/Si-doped GaAs channel structure. The Si-doped GaAs channel was composed of an n$^+$ type GaAs layer 25 having a film thickness of 30 nm and doped with Si-impurity at a concentration of $1\times10^{18}$ cm$^{-3}$.

It was found that similar advantageous effects as obtained in the above-described examples were also obtained, even if different channel structure was employed in this manner. A smaller $V_T$ shifting quantity of 18 mV was also obtained in the present example.

Example 14

Figure 16:
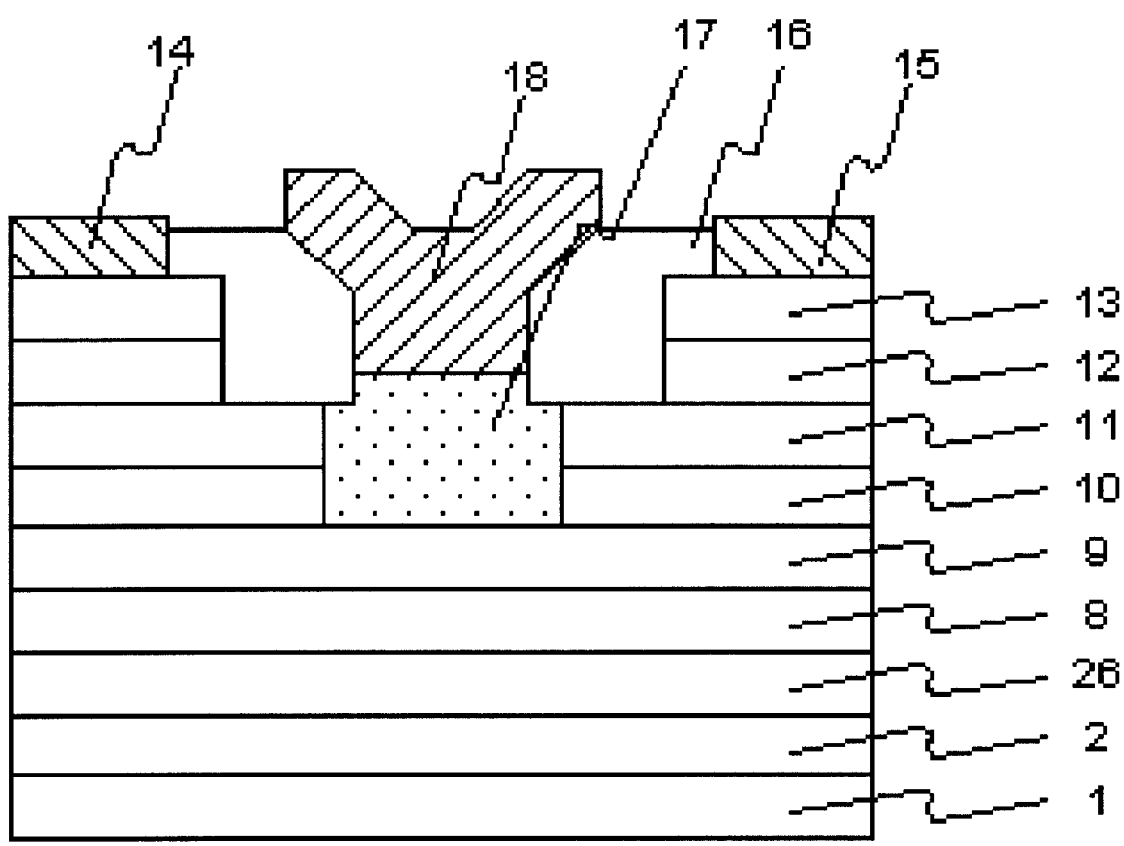
FIG. 16 is a cross-sectional view, illustrating a J-FET according to fourteenth example of the present invention.

FIG. 16 is a cross-sectional view, illustrating a J-FET of fourteenth example according to the present invention. In the present example, a buried p-n junction gate was provided on an i-GaAs/i-AlGaAs/Si-doped InGaAs channel structure. The Si-doped InGaAs channel was composed of an n$^+$ type InGaAs layer 26 having a film thickness of 30 nm and doped with Si-impurity at a concentration of $1\times10^{18}$ cm$^{-3}$. A smaller $V_T$ shifting quantity of 18 mV was also obtained in the present example.

Example 15

Figure 17:
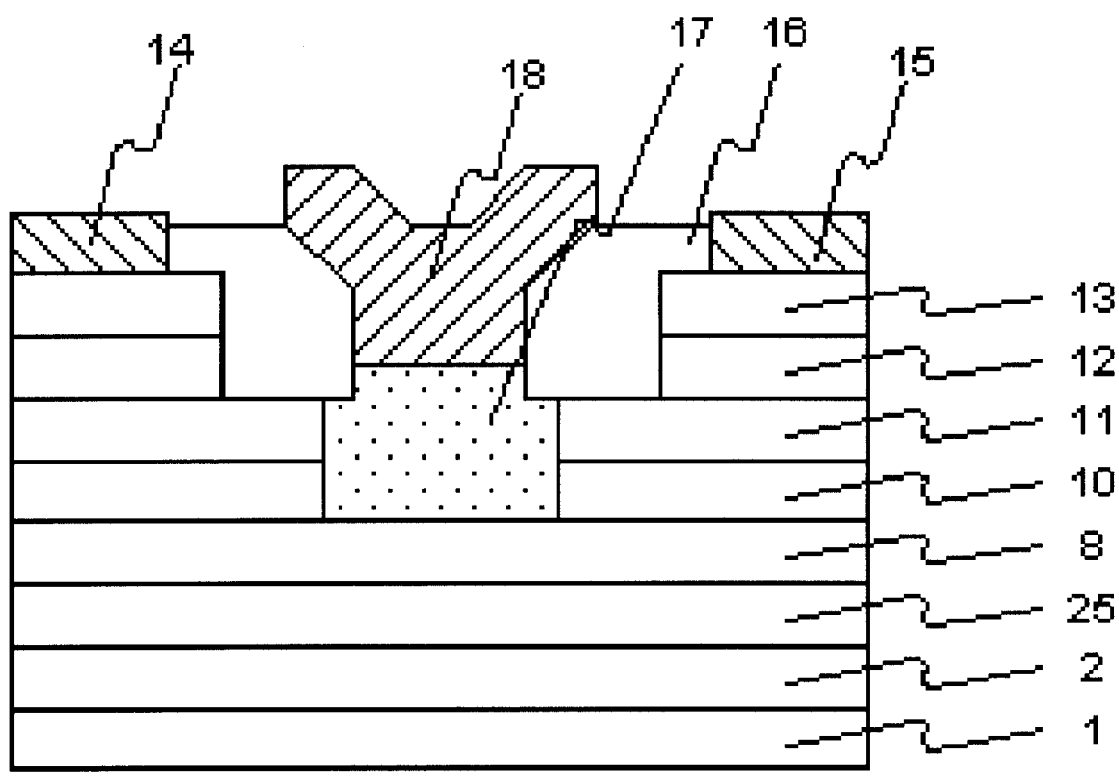
FIG. 17 is a cross-sectional view, illustrating a J-FET according to fifteenth example of the present invention.

FIG. 17 is a cross-sectional view, illustrating a J-FET of fifteenth example according to the present invention. In the present example, a buried p-n junction gate was provided on an i-AlGaAs/Si-doped GaAs channel structure. A smaller $V_T$ shifting quantity of 18 mV was also obtained in the present example.

Example 16

Figure 18:
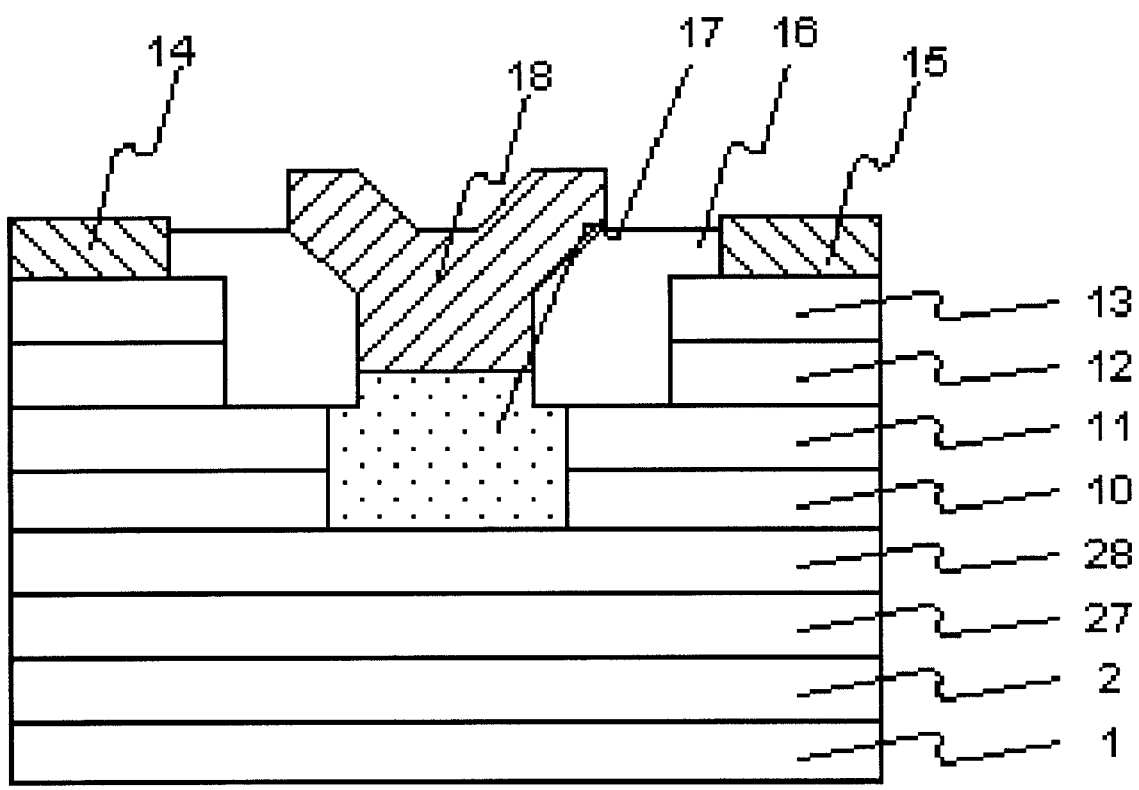
FIG. 18 is a cross-sectional view, illustrating a J-FET according to sixteenth example of the present invention.
Figure 19:
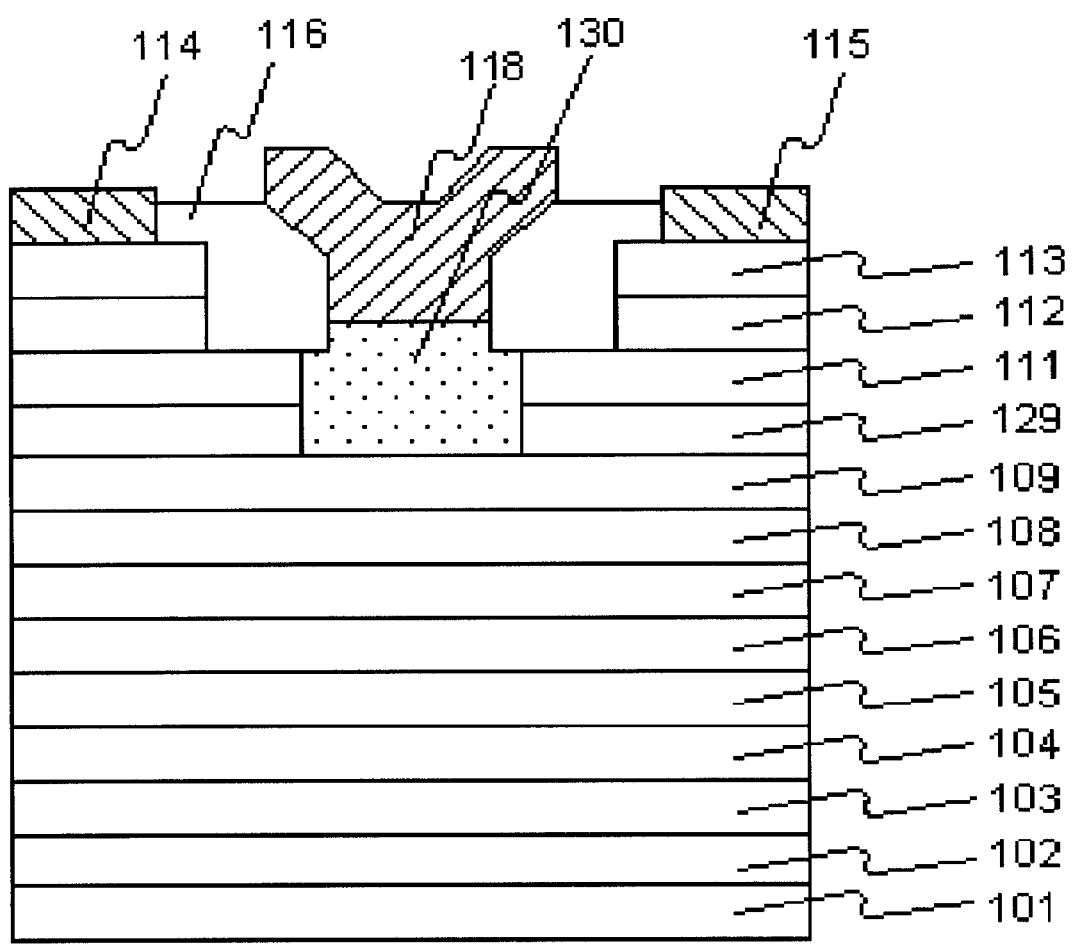
FIG. 19 is a cross-sectional view, illustrating a conventional J-FET.
Figure 20:
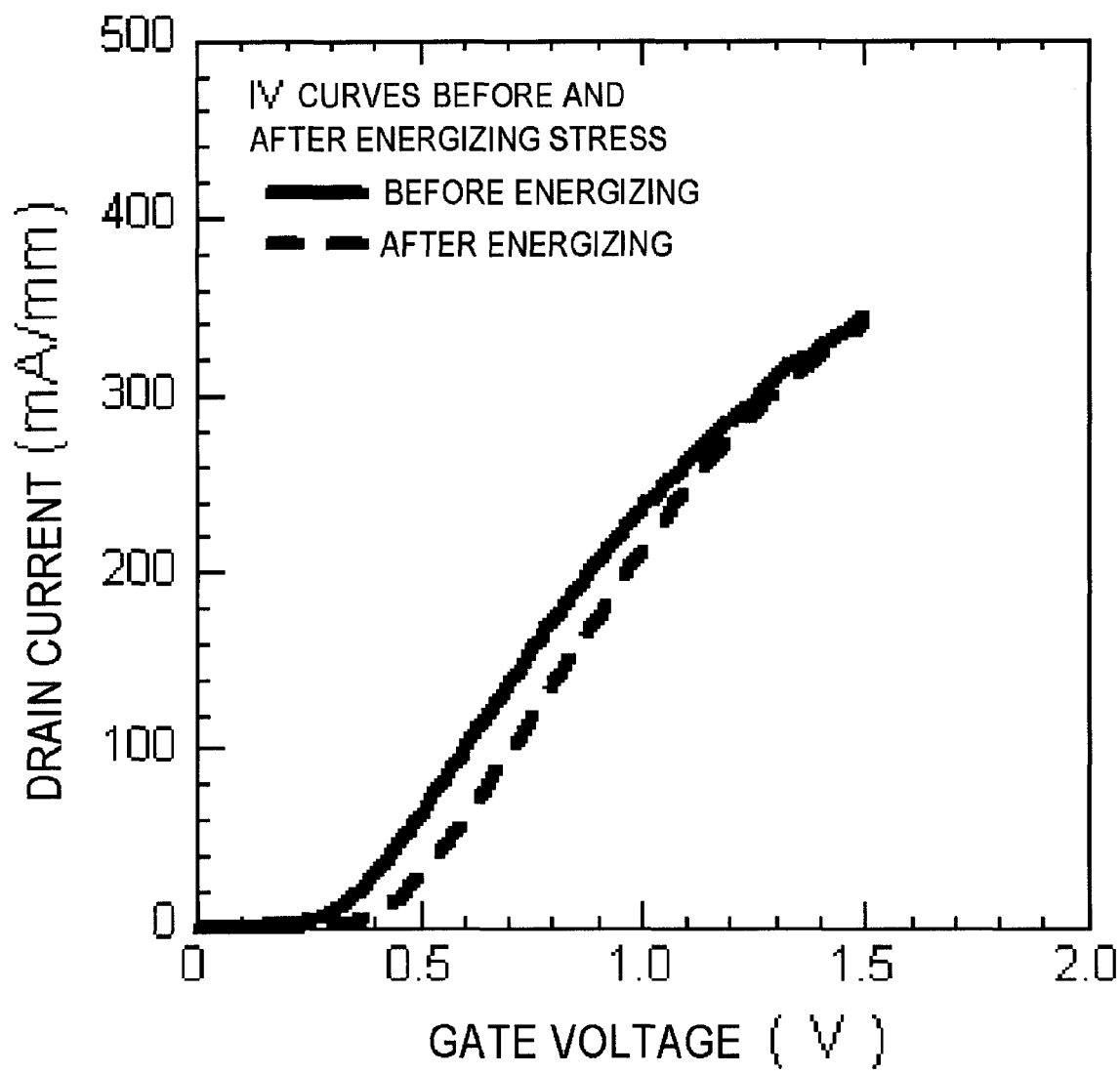
FIG. 20 is a graph, showing transmission characteristics before or after an energization with a gate current in the J-FET of FIG. 19.

FIG. 18 is a cross-sectional view, illustrating a J-FET of sixteenth example according to the present invention. In the present example, an n-type GaAs layer 27 having a film thickness of 50 nm and containing Si impurity doped with at a concentration of $5\times10^{17}$ cm$^{-3}$ and an n$^-$-type GaAs layer 28 having a film thickness of 50 nm and containing Si impurity doped with at a concentration of $5\times10^{16}$ cm$^{-3}$ were sequentially deposited from the side of the substrate 1 to form a channel structure. A buried p-n junction gate was provided on such channel structure. A smaller $V_T$ shifting quantity of 18 mV was also obtained in the present example.

It is not intended that the field effect transistors and methods for manufacturing thereof according to the present invention are limited to the configurations illustrated in the above-described embodiments, and thus various modifications thereof are also available. For example, while the example employing the undoped InGaAs layer for the channel layer is illustrated in the above-described example, similar advantageous effects as obtained in the above-described examples can also be obtained, when an undoped GaAs layer is employed for the channel layer.

Further, while GaAs-J-FETs employing epitaxial wafers that provide lattice matches on the GaAs substrate are illustrated in the above-described examples, similar advantageous effects can also be obtained in InP-FETs or GaN-FETs.

It is apparent that the present invention is not limited to the above embodiment, and may be modified and changed without departing from the scope and spirit of the invention.

What is claimed is:

1. A field effect transistor, comprising:
   a channel layer, which is capable of accumulating a first conductivity type carrier;
   a semiconductor layer, provided on said channel layer and containing a second conductivity type impurity; and
   a gate electrode provided on said semiconductor layer,
   wherein a concentration of hydrogen contained in said semiconductor layer is lower than a concentration of said second conductivity type carrier in the semiconductor layer, and
   wherein said concentration of said second conductivity type impurity is equal to or more than $1\times10^{20}$ cm$^{-3}$.

2. The field effect transistor as set forth in claim 1, wherein a relationship of said concentration of hydrogen (dh [cm$^{-3}$]) and said concentration of carrier (dc [cm$^{-3}$])is:

$$dh \leq 4.4\times10^{-1}\times dc - 1.5\times10^{19}.$$

3. The field effect transistor as set forth in claim 1, wherein said concentration of hydrogen is equal to or lower than $2\times10^{18}$ cm$^{-3}$.

4. The field effect transistor as set forth in claim 1, wherein the impurity of said second conductivity type is carbon.

* * * * *